(12) United States Patent
Hio et al.

(10) Patent No.: US 6,305,968 B1
(45) Date of Patent: Oct. 23, 2001

(54) TERMINAL HARDWARE FOR FLAT-TYPE CONDUCTOR AND A METHOD OF MAKING A TERMINAL CONDUCTOR

(75) Inventors: Masahide Hio; Hajime Okada, both of Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 09/686,891

(22) Filed: Oct. 12, 2000

(30) Foreign Application Priority Data

Oct. 22, 1999 (JP) .................................................. 11-301326

(51) Int. Cl.⁷ ...................................................... H01R 4/24
(52) U.S. Cl. ............................................................... 439/422
(58) Field of Search .................................... 439/421, 422, 439/423, 424, 877

(56) References Cited

U.S. PATENT DOCUMENTS

| | | |
|---|---|---|
| 4,082,402 | 4/1978 | Kinkaid et al. . |
| 4,560,224 * | 12/1985 | Weisenburger ...................... 439/422 |
| 4,832,620 | 5/1989 | Yamamoto . |
| 4,834,673 | 5/1989 | Beinhaur et al. ..................... 439/422 |
| 4,975,081 * | 12/1990 | Daly et al. ........................... 439/422 |
| 6,135,779 * | 10/2000 | Koch et al. .......................... 439/422 |

FOREIGN PATENT DOCUMENTS 63-73862   5/1988   (JP) .

* cited by examiner

*Primary Examiner*—Tho D. Ta
(74) *Attorney, Agent, or Firm*—Greenblum & Bernstein, P.L.C.

(57) ABSTRACT

Terminal hardware for a flat-type conductor is provided which can provide a high contact pressure between the terminal hardware and the conductor and a superior holding power against a tension tending to separate the terminal hardware from the conductor. At a terminal end of the flat-type conductor, the conductor is exposed on an upper surface. A base plate is formed to extend from a rear end of the terminal hardware, and a top plate is provided so as to face the base plate and be capable of being opened and closed. A pair of crimping portions are provided at opposite side edges of a rear end of the base plate. Further, both the base plate and the top plate have undulating portions, respectively. The terminal end of the flat-type conductor is inserted between the base plate and the top plate. The pair of crimping portions pierces the insulation sheet of the flat-type conductor from one side toward the other. Then, the terminal end of the flat-type conductor is sandwiched between the base plate and the top plate from both of the upper and lower surfaces, and is compressed. At the same time, the pair of the crimping portions is crimped. Accordingly, a portion of the flat-type conductor where the conductor is provided is bent and sandwiched between the base plate and the top plate contacts the conductor.

16 Claims, 12 Drawing Sheets

FIG. 6
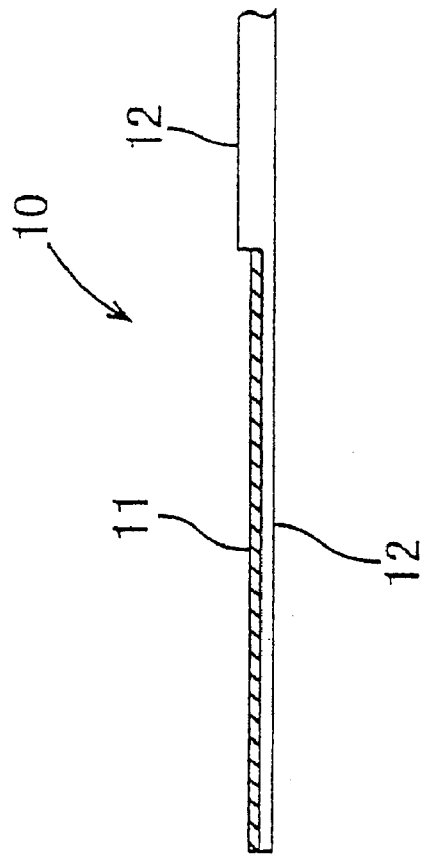
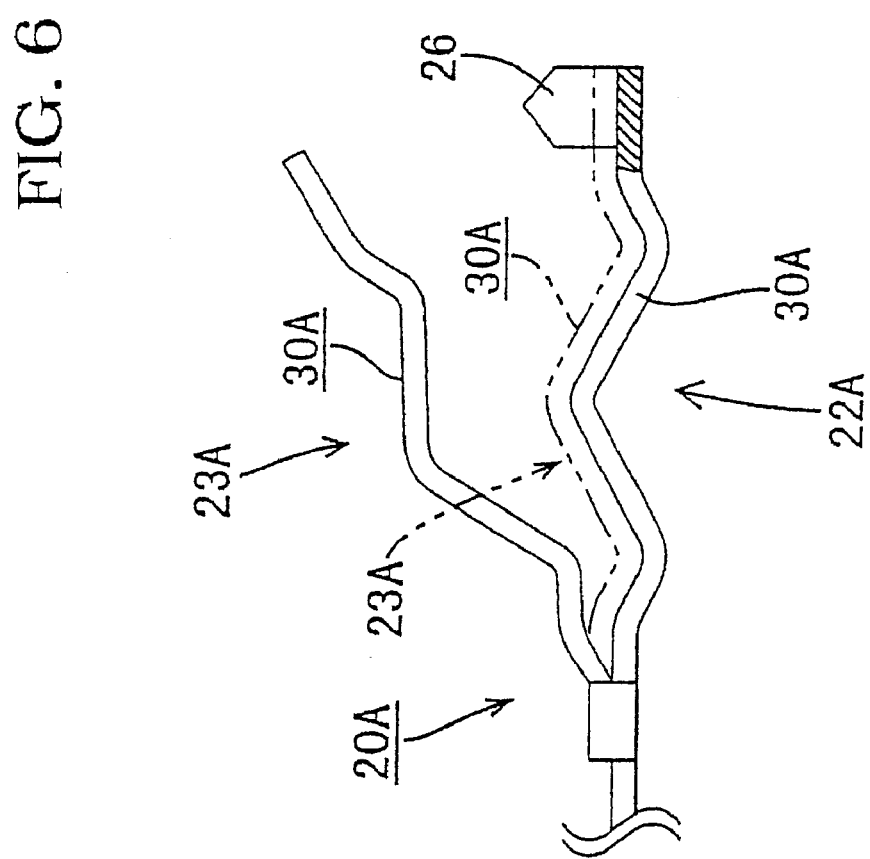

TERMINAL HARDWARE FOR FLAT-TYPE CONDUCTOR AND A METHOD OF MAKING A TERMINAL CONDUCTOR

BACKGROUND OF THE INVENTION

1. Field of Invention

The present invention relates to a terminal hardware used to connect to a terminal of a flat-type conductor, and to a method of making the terminal hardware.

2. Description of Related Art

A flexible flat cable (FFC) and a flexible printed circuit (FPC) are known as flat-type conductors. For example, a construction of an FFC is described as follows. Plural strips of conductors are aligned in parallel and covered and pressed by insulating sheets from both upper and lower sides. Thus, the FFC is formed to have a flexible ribbon-shape. There are two methods to connect terminal hardware to each of the conductors of the FFC as described above: a method that connects the terminal hardware to the conductor covered by the insulating sheet, and a method that connects the terminal hardware to the conductor exposed on one side by peeling the insulating sheet of the terminal.

The latter method is disclosed in Japanese Utility Model Laid-Open Publication No. Sho. 63-73862, for example. As shown in FIG. 16, at the terminal of FFC 1, a predetermined amount of an insulating sheet 2 on the upper side is peeled, and a conductor 3 is exposed on the upper side. Terminal hardware 4 having a base plate 6 extending from a rear side of a connection portion 5 is provided to be connected to another terminal hardware. Further, a top plate 7 is integrally formed with the base plate 6 so as to face the base plate 6 and to be capable of being opened and closed with respect to the base plate 6. Claws 8 are provided at opposite side edges of the open end of the top plate 7.

A portion of the exposed conductor 3 is inserted between the base plate 6 and the top plate 7. The claws 8 pierce the FFC 1 and are crimped on the lower side to opposite side edges of the base plate 6. Thus, the FFC 1 is sandwiched between the base plate 6 and the top plate 7, and the top plate 7 is pressed against the conductor 3 to establish connection.

However, in the above-described method, since the entire surface of the flat-shaped top plate 7 contacts the conductor 3, the contact pressure becomes low. Thus, the reliability of electrical contact is poor.

Further, when a tension is applied in a longitudinal direction of the FFC 1, there is a possibility that the claws 8 separate from the FFC 1 (insulating sheet 2) and the terminal hardware becomes separated from the FFC 1, since the claws 8 are caught by the FFC 1 only at a portion where the claws 8 pierce the FFC.

When a terminal hardware is connected to the conductor 3, which is exposed at a surface, there is a way to avoid the claws 8 piercing the FFC. In this case, the terminal of FFC is formed to have a comb-shape so that each portion where the conductor 3 is exposed is left as a tooth portion. The claws 8 hold the tooth portions of the comb-shape and are crimped thereto to fix the terminal hardware to the terminal of the FFC. However, the terminal hardware 4 is more easily separated from the terminal particularly in this case.

The present invention is provided to eliminate the above-described drawbacks. An objective of the present invention is to provide a terminal hardware for a flat-type conductor having a high contact pressure between a conductor and the terminal hardware, and a superior holding force against a tension to separate the terminal hardware from the terminal.

SUMMARY OF THE INVENTION

To achieve the above and/or other goals, the present invention provides a terminal hardware connected to a terminal end of a flat-type conductor having a conductor exposed on one surface. The terminal hardware includes a pair of plates that face each other and receive the conductor therebetween, and a crimping portion that projects from a side edge of one of the pair of the plates and that is bendable and crimpable to a side edge of the other one of the pair of the plates. The pair of plates respectively has first and second undulating portions. The first and second undulating portions undulate in a longitudinal direction of the pair of the plates and are configured to be in contact with each other. Preferably, the crimping portion is a pair of crimping portions.

According to the features of the present invention, since the exposed surface of the conductor contacts one of the pair of the plates while the conductor is bent in an undulating-shape, high contact pressure can be achieved. In addition, since the terminal hardware of the present invention having undulating plates can provide a wider contact area than the terminal hardware with flat plates having the same total length, a stable electrical connection can be achieved. Further, since the pair of the plates bend the conductor in an undulating-shape and contacts therewith, an area of the conductor with a total width can be used to hook the terminal conductor. Accordingly, the holding power against a tension to separate the terminal hardware from the terminal can be increased.

In another aspect of the present invention, the first and second undulating portions are configured to fit against each other without a gap when the flat-type conductor is not inserted therebetween. In this case, when the flat-type conductor is inserted between the pair of the plates, the first and the second wave portions do not fit against each other. Thus, the flat-type conductor has portions having different amounts of compression between the pair of the plates. In particular, at a portion where an amount of compression is great, the contact pressure between the conductor and the plate facing the exposed surface of the conductor becomes high. Accordingly, the reliability of electrical contact can be improved. Further, the holding power against a tension to separate the terminal hardware from the terminal can be further increased.

In another aspect of the present invention, the terminal hardware further includes a cut-in projection provided on one of the pair of plates that faces the exposed surface of the conductor. The cut-in projection forcefully presses against and bites into the conductor. According to this feature of the invention, the contact pressure and holding power against a tension to separate the terminal hardware from the terminal can further be improved.

The cut-in projection can be formed by cutting an edge of a triangle in one of the pair of the plates and by embossing the triangle in a wedged-shape. The cut edge is perpendicular to the longitudinal direction of the pair of the plates and is located forwardly in a direction to which the terminal hardware is separated from the terminal of the flat-type conductor. According to another feature of the present invention, the surface projecting in a wedged-shape of the cut-in projection is perpendicular to a direction of a tension tending to separate the terminal hardware from the terminal and forcefully presses against and bites into the conductor. Thus, the holding power against the tension tending to cause separation can be further increased.

In another aspect of the present invention, the pair of plates is formed unitarily and in one piece so as to be able to be opened and closed. Thus, the number of components can be reduced and it becomes easy to handle the terminal hardware.

Preferably, the first and second undulating portions include a ridge and two troughs provided at opposite sides of the ridge in the longitudinal direction of the pair of plates.

Alternatively, the first and second undulating portions can include two troughs spaced in the longitudinal direction of the pair of plates. Further, a first cut-in projection can be provided between two troughs, and a second cut-in projection is provided at a rear end of the pair of plates. Furthermore, a first pair of crimping portions can be provided on opposite side edges between the two troughs, and a second pair of crimping portions can be provided on opposite side edges at a rear end of the pair of plates.

Preferably, the cut-in projection is located at substantially the same position in the longitudinal direction of the pair of plates as a position of the crimping portion.

In another aspect of the present invention, a method for making a terminal hardware is provided. The method includes punching out a blank from a metal plate. The metal plate has a base plate portion, a tab portion extending from one end of the base plate portion, a top plate portion parallel to the base plate portion and a folding portion which projects from side edge of a connection point of the base plate portion and the tab portion and connecting the base plate portion and the top plate portion, and a crimping portion projected from a side edge of one of the base plate portion or the top plate portion. The method further includes folding the folding portion so that the top plate portion faces the base plate portion and can be opened and closed at an end of the top plate portion, forming the base plate portion and the top plate portion with undulations, and bending the crimping portion to project toward the other of the base plate portion and the top plate portion.

Further, the method can include forming a cut in the top plate on a line perpendicular to the longitudinal direction of the top plate portion, and embossing a triangle portion of the top plate portion to configure a wedge-shaped portion extending toward the bottom plate portion. The triangle portion includes the cut as one side and an apex directed toward an end of the top plate portion in a longitudinal direction of the top plate portion.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein:

FIG. 6 is a partial cross-sectional view illustrating the FFC and the terminal hardware before connection, according to a second embodiment of the present invention;

DETAILED DESCRIPTION OF PREFERRED EMBODIMENTS

In the following, embodiments of the present invention are described with reference to figures.

A first embodiment of the present invention is explained with reference to FIGS. 1 through 5.

Figure 1:
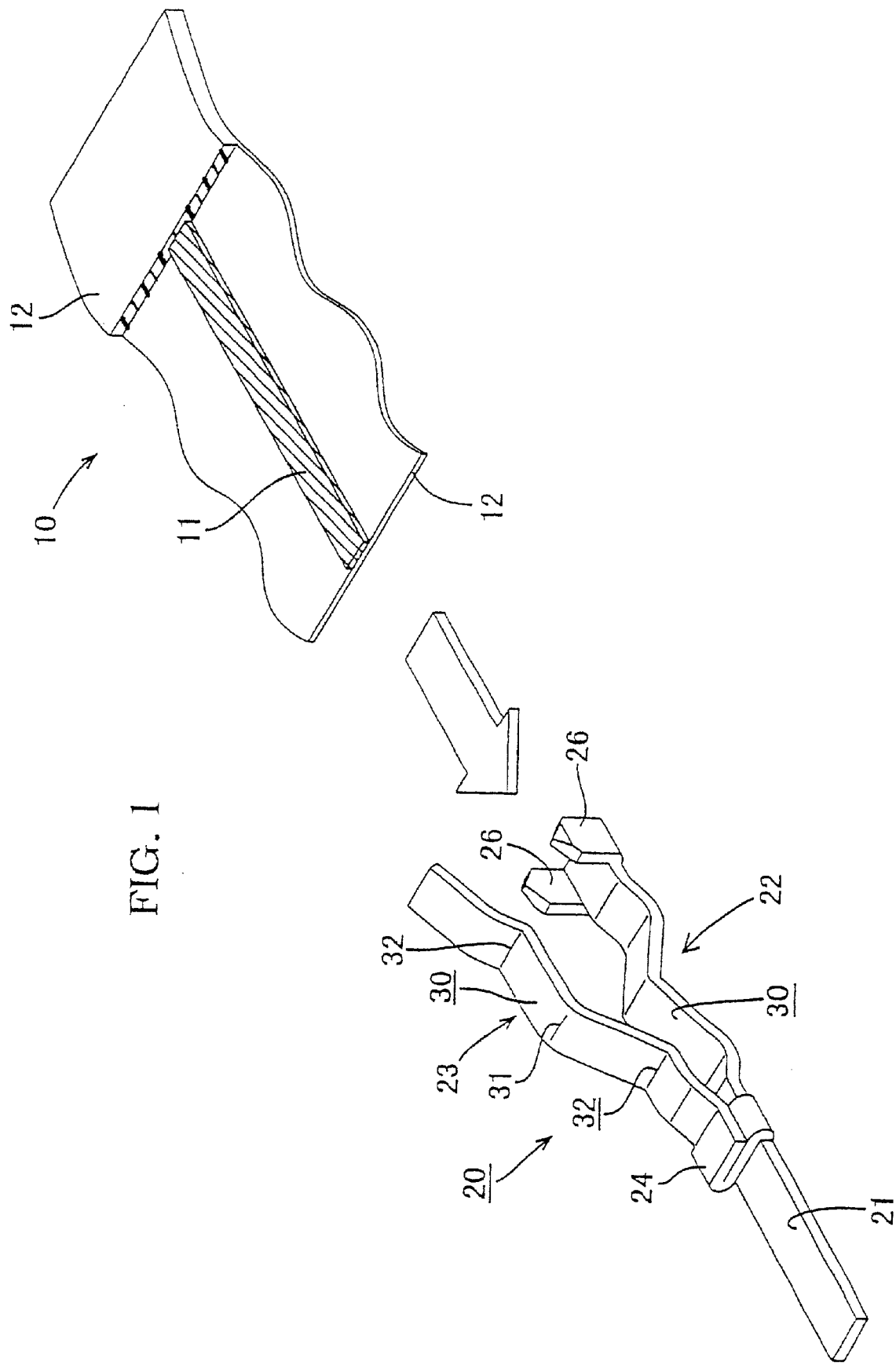
FIG. 1 is a perspective view illustrating an FFC and a terminal hardware before connection, according to a first embodiment of the present invention.

In FIG. 1, a flexible flat cable (FFC) 10 is shown as an example of a flat-type conductor. Plural strips of conductors 11 are aligned in parallel and spaced at predetermined distances. The plural strips of conductors 11 are covered and pressed by insulating sheets 12 from both upper and lower sides. Thus, the FFC is formed to have a flexible ribbon-shape. Predetermined areas of the insulating sheet on an upper side are peeled off at a terminal end of the FFC 10. Thus, conductors 11 are aligned while the upper surfaces are exposed. The insulating sheet may be peeled off on both the upper and lower sides.

Figure 2:
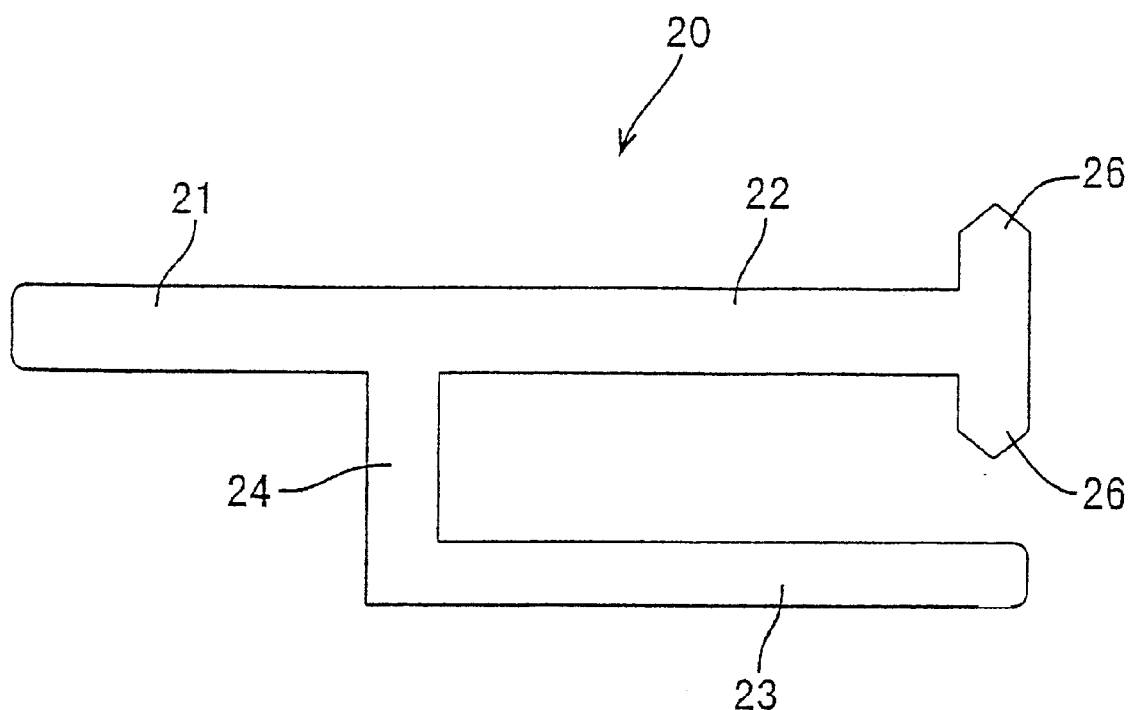
FIG. 2 depicts a blank used to form a terminal hardware according to the first embodiment of the present invention.

The terminal hardware 20 of the present embodiment is a male terminal hardware and is made of a metal plate having superior conductivity by press molding, for example. The terminal hardware 20 includes a tab 21, which is configured to be engaged with a female terminal hardware, and a base plate 22 extending from the rear end of the tab 21. The terminal hardware 20 further includes a top plate 23 facing the base plate 22. A blank for forming the terminal hardware 20 is shown in FIG. 2. The blank has the tab 21 and the base plate 22 formed as a single strip. The top plate 23 is provided parallel to the base plate 22 via a folding portion 24, which projects from a side edge at a proximal end of the tab 21 (i.e. the connection point between the tab 21 and the base plate 22). The pair of crimping portions 26 project from opposite side edges of the base plate 22. The blank may be formed, for example, by punching from the metal plate. When the folding portion 24 is tightly folded twice as shown in FIG.

1, the top plate 23 faces the base plate 22 and can be opened and closed at the rear end (right side in FIG. 1). Then, the base plate 22 and the top plate 23 are formed with complementary undulations, for example, by pressing. Finally, the crimping portions are bent toward the top plate 22 to extend upwardly from the base plate.

A portion of the top plate 23 faces the base plate 22 so as to be able to be opened and closed and is about the same length as the length of the conductor 11 exposed. Further, the widths of the base plate 22 and the top plate 23 are set slightly wider than the width of the conductor 11. The pair of crimping portions 26 project upwardly from opposite side edges at the rear end of the base plate 22. The tip of each crimping portion is formed to be sharp.

Further, the base plate 22 and top plate 23 have undulating portions 30. Each undulating portion includes a large ridge 31 approximately at the center in the longitudinal direction and small troughs 32 at the base of both sides of the ridge 31. The undulating portions of the base plate 22 and top plate 23 are formed so as to tightly engage with each other almost without a gap when the terminal of the FFC 10 is sandwiched therebetween.

In the following, a connection process of the first embodiment is explained.

Figure 3:
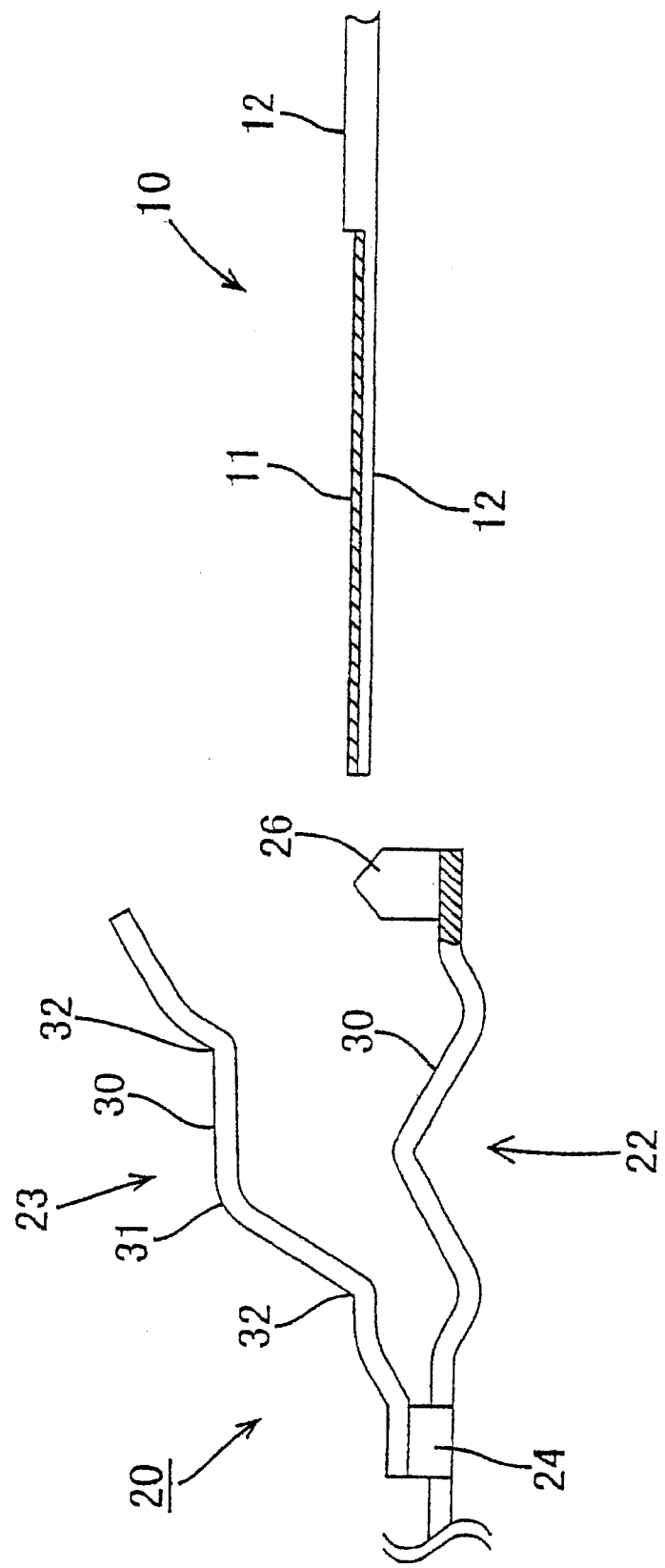
FIG. 3 is a partial cross-sectional view illustrating the FFC and the terminal hardware before connection, according to the first embodiment of the present invention.
Figure 4:
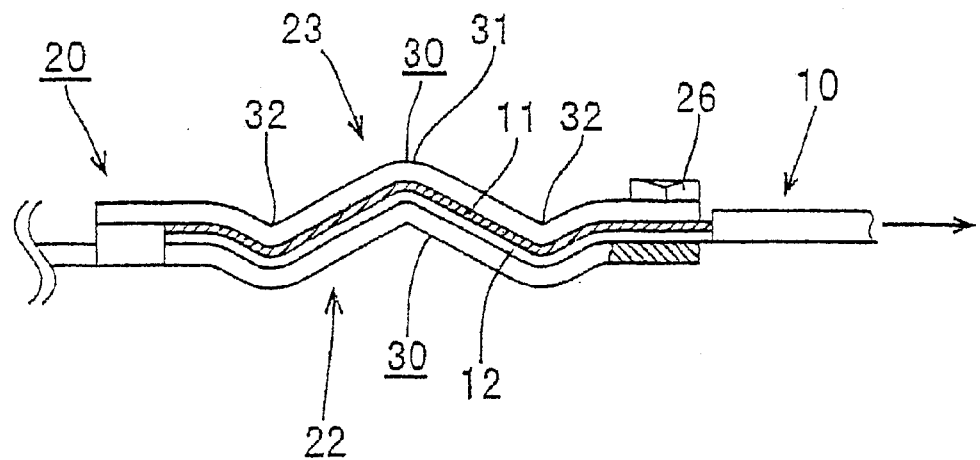
FIG. 4 is a partial cross-sectional view illustrating the FFC and the terminal hardware after connection, according to the first embodiment of the present invention.
Figure 5:
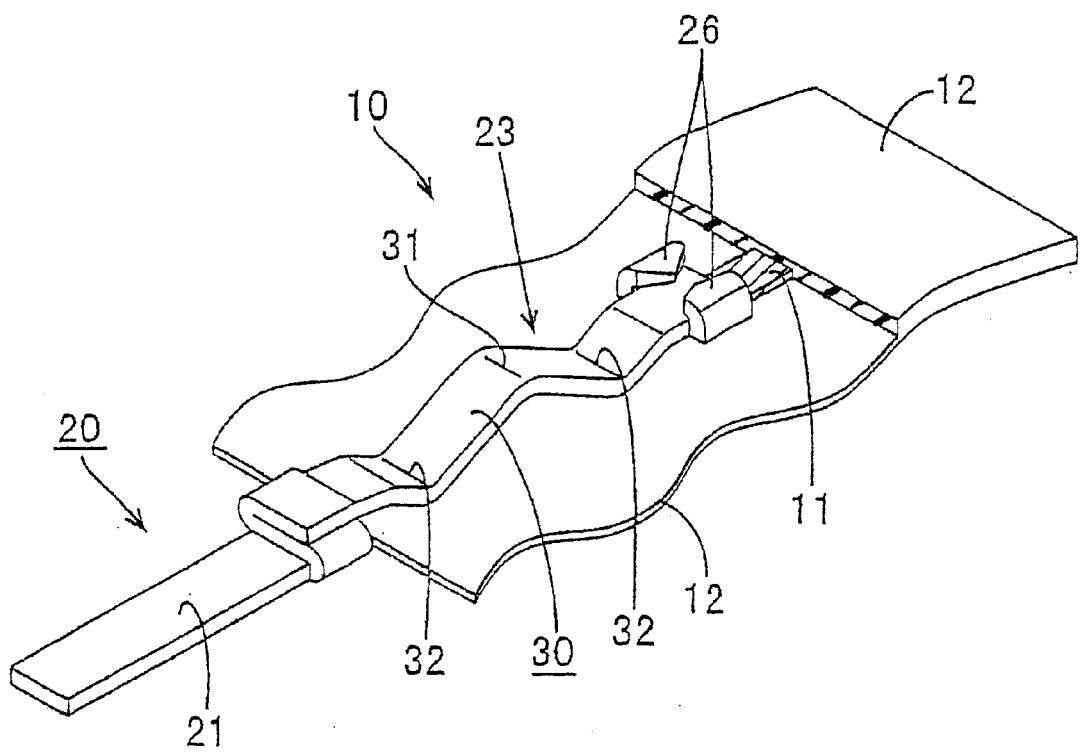
FIG. 5 is a perspective view illustrating the FFC and the terminal hardware after connection, according to the first embodiment of the present invention.

As shown in FIGS. 1 through 3, the top plate 23 of the terminal hardware is opened upwardly. Under this condition, the FFC 10 is inserted between the base plate 22 and the top plate 23, while the terminal hardware 20 is aligned with the conductor 11. Next, the pair of the crimping portions 26 formed on the base plate 22 pierces the insulating sheet 12 upwardly. Then, the terminal on the FFC 10 is sandwiched between the base plate 22 and the top plate 23 and is pressed therebetween. Then, the pair of the crimping portions 26 is bent inwardly and is crimped to opposite side edges of the top plate 23 at the rear end. Accordingly, as shown in FIGS. 4 and 5, the base plate 22 and the top plate 23 hold the conductor 11 therebetween and are closed together to be connected with each other.

According to the first embodiment, since the conductor 11 is sandwiched between the base plate 22 and the top plate 23, both of which have undulating portions 30, the conductor 11 is also bent in the same undulating-shape. In other words, since the bent top plate 23 contacts the conductor 11 so as to be engaged with the conductor 11, high contact pressure can be achieved and consequently a stable electrical connection can be achieved.

Further, the FFC 10 as described above is used in such a way that the terminal hardware 20 connected to the terminal is stored in a cavity of a connector housing (not shown). A tension toward the rear end (direction of the arrow in FIG. 4) may be applied to the FFC 10. However, according to the present embodiment, since the top plate 23 and the base plate 22 bend the FFC 10 in an undulating-shape and engage with the FFC 10, a firm engagement can be provided. Thus, the holding power against the tension to separate increases. Accordingly, the terminal hardware 20 is prevented from easily separating from the terminal of the FFC 10.

Figure 7:
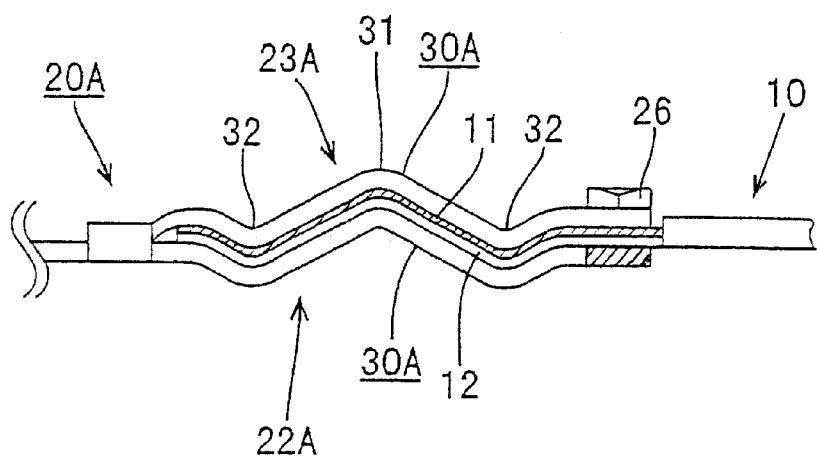
FIG. 7 is a partial cross-sectional view illustrating the FFC and the terminal hardware after connection, according to the second embodiment of the present invention.
Figure 8:
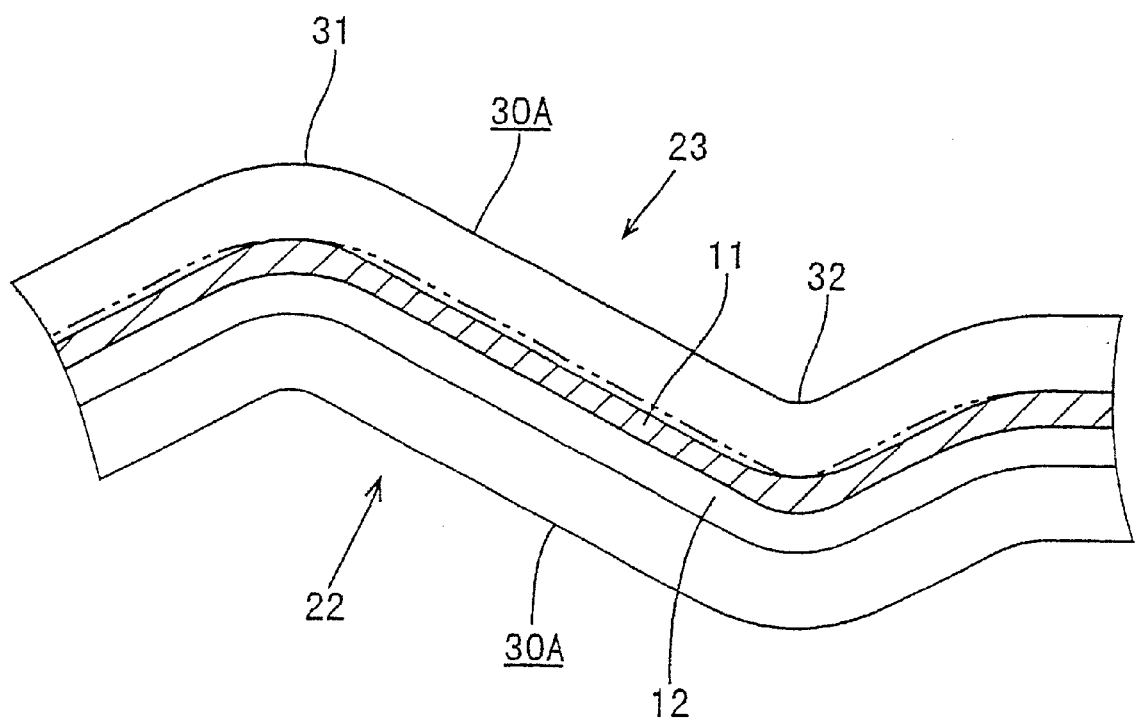
FIG. 8 is an enlarged view illustrating the FFC and the terminal hardware of FIG. 7.

FIGS. 6 through 8 show a second embodiment of the present invention. The second embodiment can be called a modification of the first embodiment. Therefore, in the following explanation, the different portions have been mainly explained. The same numerals as in the first embodiment are given to portions having the same functions as that of the first embodiment, and a repetition of the explanation thereof is omitted.

In the terminal hardware 20A of the second embodiment, the base plate 22A and the top plate 23A facing the base plate 22A respectively have undulating portions 30A in the same manner as the first embodiment. However, as shown by the broken line in FIG. 6, the terminal hardware 20A is formed so that the undulating portions 30A fit to each other without a gap, when the base plate 22A and the top plate 23A contact each other without inserting the terminal of the FFC 10 therebetween.

In the second embodiment, as in the first embodiment, as shown in FIG. 6, the terminal of FFC 10 is inserted between the top plate 23A and the base plate 22A, while the top plate 23A is opened upwardly. Then, as shown in FIG. 7, the top plate 23A and the base plate 22A are closed and press the terminal of FFC 10. As described above, the undulating portions 30A of the base plate 22A and the top plate 23A are formed in a shape to fit to each other when the FFC 10 is not inserted therebetween. Thus, when the terminal of the FFC 10 is inserted between the base plate 22A and the top plate 23A, the FFC 10 is deformed and compressed. In more detail, as shown in FIG. 8, where the original thickness of the conductor 11 is as shown by the broken line, an amount of compression of the conductor 11 is relatively small at the vicinity of the ridge 31 and trough 32 of the undulating portion 30A, while an amount of compression is larger at the other wide areas. Accordingly, as a whole, a high contact pressure can be achieved between the top plate 23A and the conductor 11 at the wide areas, and thus, reliability of the electric connectivity can be improved.

Next, the third embodiment of the present invention is explained with reference to FIGS. 9 through 14. In the following, portions that are different from the first embodiment are mainly explained. The same numerals as in the first embodiment are given to portions having the same functions as those of the first embodiment, and a repetition of the same explanation is omitted.

In the terminal hardware 20B of the third embodiment, the base plate 22B and the top plate 23B respectively have undulating portions 40, each of which includes two troughs 41 spaced in a longitudinal direction. Two pairs of crimping portions project upwardly from opposite side edges of the flat portion 42 at the rear end and from opposite side edges of the flat portion 42 between the two troughs of the base plate 22B, respectively.

Figure 10:
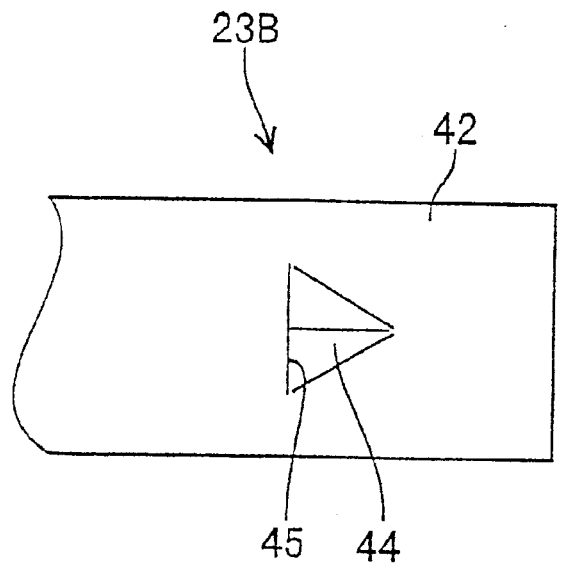
FIG. 10 is a partial top plan view illustrating the shape of a cut-in projection according to the third embodiment.
Figure 11:
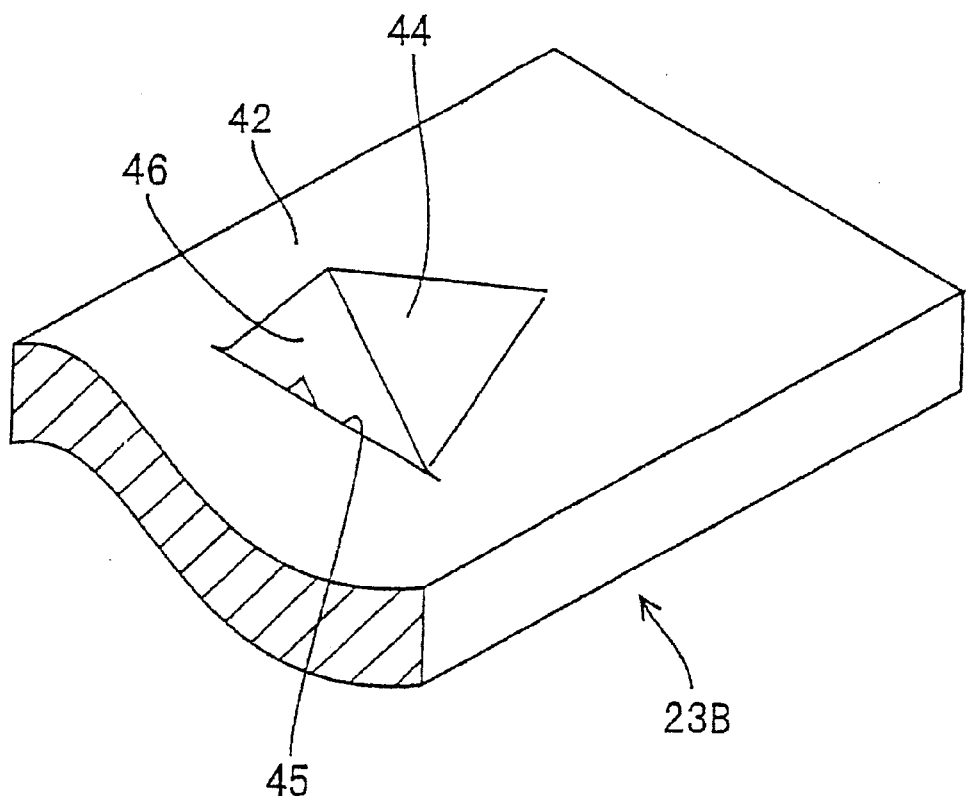
FIG. 11 is a perspective view from a bottom side illustrating the cut-in projection of FIG. 10.

The top plate 23B includes two cut-in projections 44 respectively provided on the flat portions 42 at the front and rear side of the rear side trough 41. In more detail, as shown in FIG. 10, each cut-in projection 44 forms a triangle having an apex directed rearwardly in the plane of the flat portion 42. One side 45 in FIG. 10 of the triangle, which is perpendicular to the longitudinal direction of the top plate 23, is cut off, and the flat portion 42 of the triangle is embossed to have a wedged-shape extending toward the bottom side. As shown in FIG. 11, which is a perspective view from the bottom side, a cut end 46, which is shaped as a downward triangle, projects in a direction perpendicular to the longitudinal direction of the top plate 23B.

Figure 9:
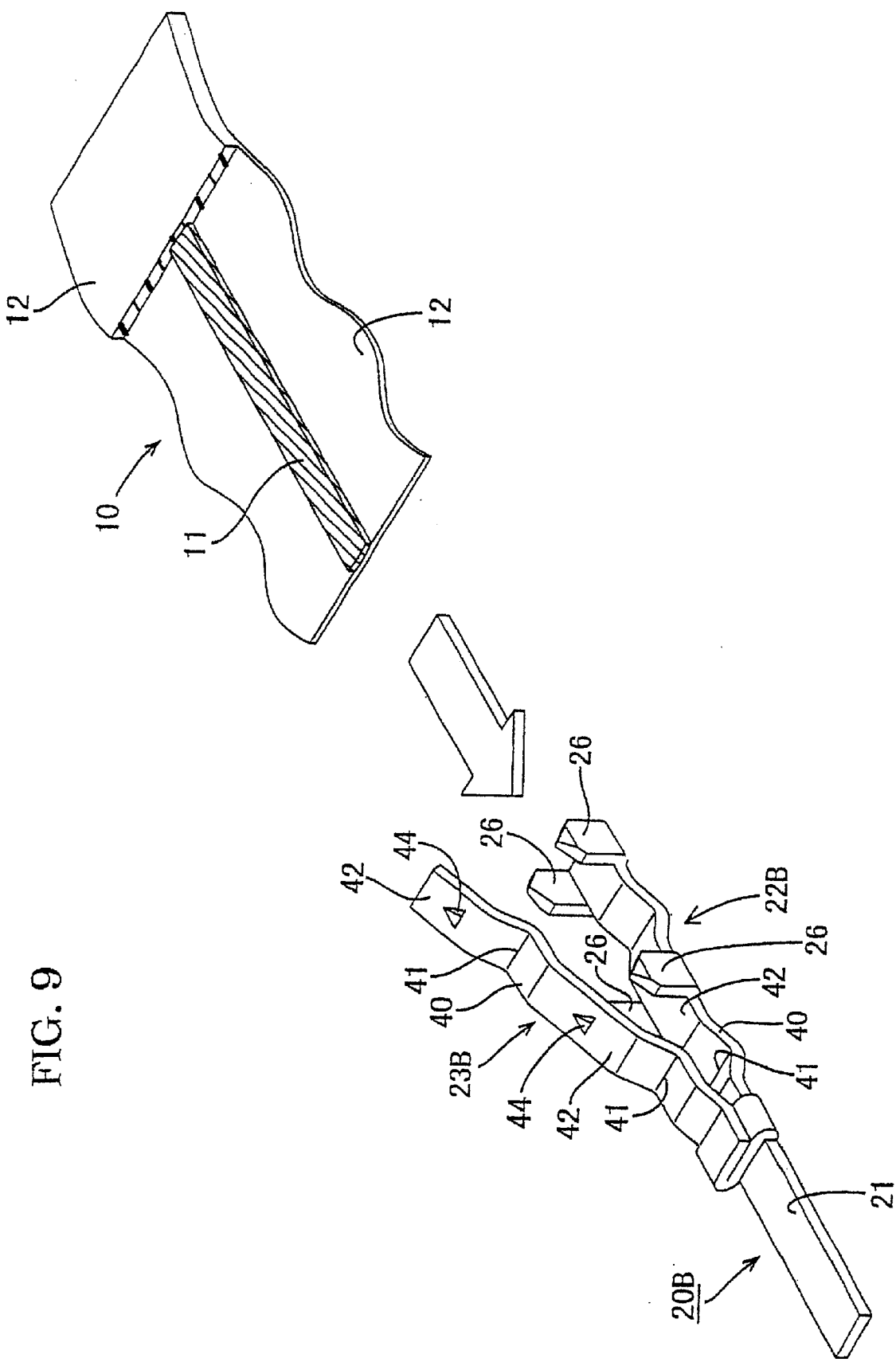
FIG. 9 is a perspective view illustrating the FFC and the terminal hardware before connection, according to a third embodiment of the present invention.
Figure 12:
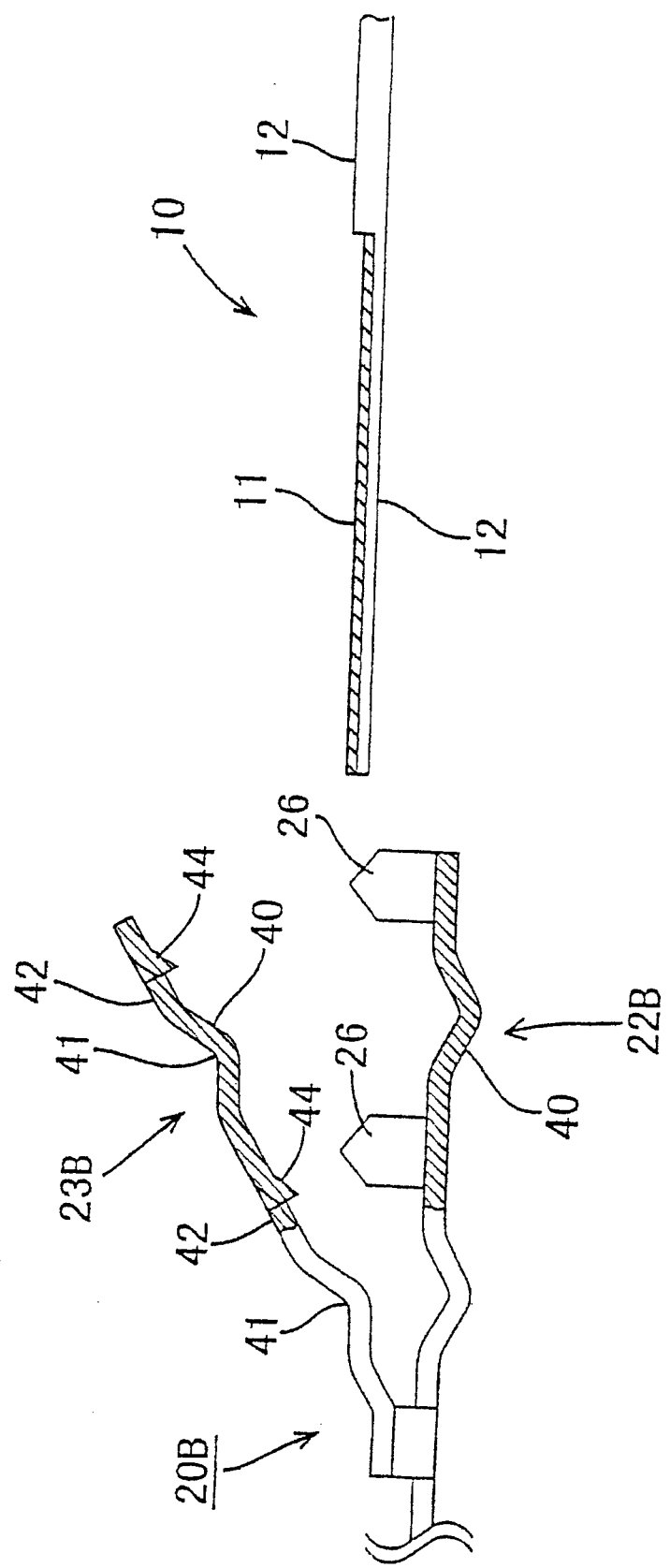
FIG. 12 is a partial cross-sectional view illustrating the FFC and the terminal hardware before connection, according to the third embodiment of the present invention.
Figure 13:
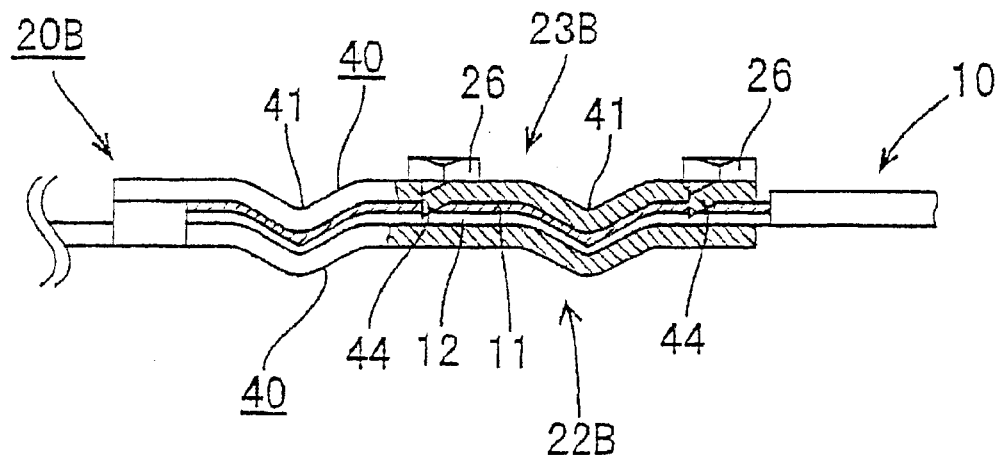
FIG. 13 is a partial cross-sectional view illustrating the FFC and the terminal hardware after connection, according to the third embodiment of the present invention.
Figure 14:
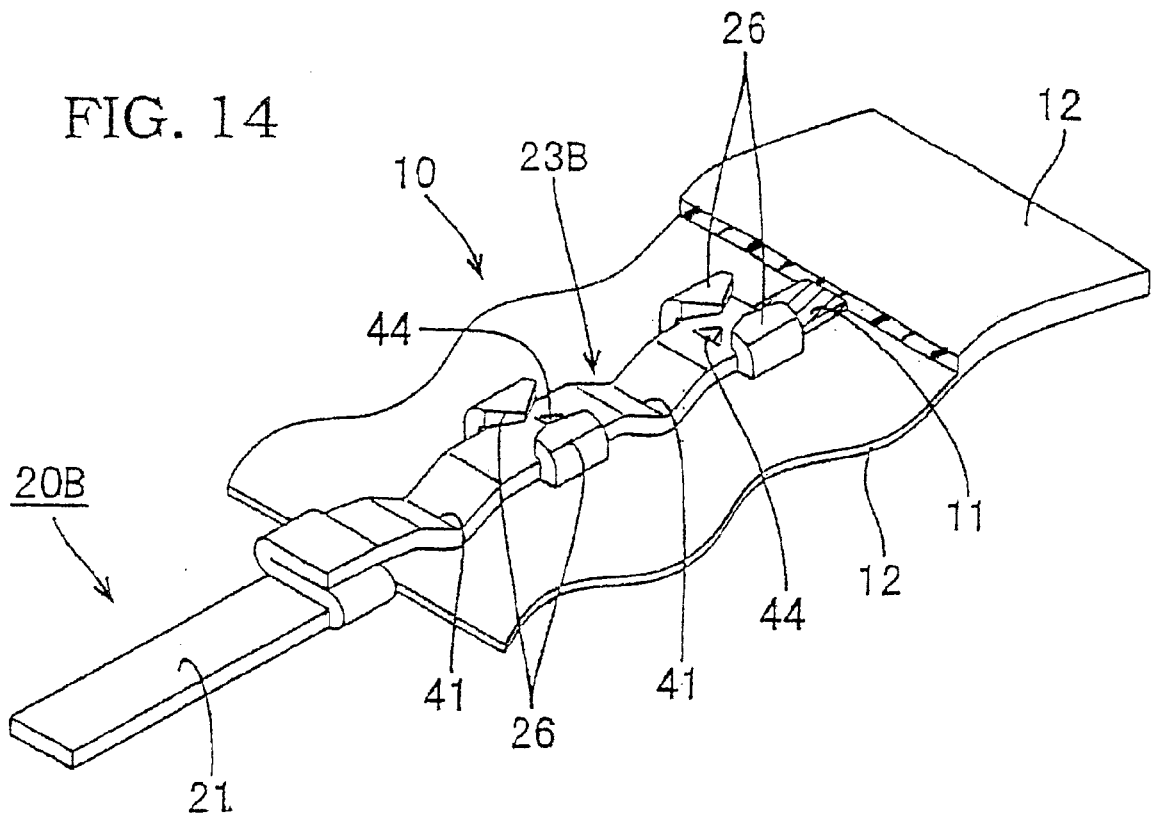
FIG. 14 is a perspective view illustrating the FFC and the terminal hardware after connection, according to the third embodiment of the present invention.

When the terminal hardware 20B of the third embodiment is connected to the terminal of FFC 10, as shown in FIGS. 9 and 12, while the top plate 23B is opened with respect to the base plate 22B, the terminal of FFC 10 is inserted between the base plate 22B and the top plate 23B. Then, the two pairs of the crimping portions 26 projecting from the base plate 22B pierce the insulating sheet 12 upwardly so that the terminal of the FFC 10 is sandwiched between and pressed by the base plate 22B and the top plate 23B. At the same time, as shown in FIGS. 13 and 14, the two pairs of the crimping portions 26 are respectively bent inwardly and are crimped to opposite side edges of the flat portions 42 of the top plate 23 to complete the connection.

Thus, according to the third embodiment, as well as in the first and the second embodiments, the conductor 11 contacts the top plate 23B while the conductor 11 is bent. In particular, a high contact pressure can be achieved at the vicinity of the troughs 41 of the top plate 23B.

Further, when the FFC 10 is sandwiched between the top plate 23B and the base plate 22B, the cut-in projections 44 forcefully press against and bite into the conductor 11. Accordingly, a hook can be provided against a direction of a tension tending to separate the terminal hardware from the terminal. In addition, the cut end 46, which is perpendicular to the longitudinal direction of the top plate 23B, is provided in the front side of the cut-in projection 44. The cut end 46 forcefully presses against and bites into the conductor 11. Accordingly, the holding power of the FFC 10 against the tension further increases.

Further, since the above-described cut-in projections 44 can provide high contact pressure between the top plate 23B and the conductor 11, it is efficient to improve reliability of the electrical connectivity.

Figure 15:
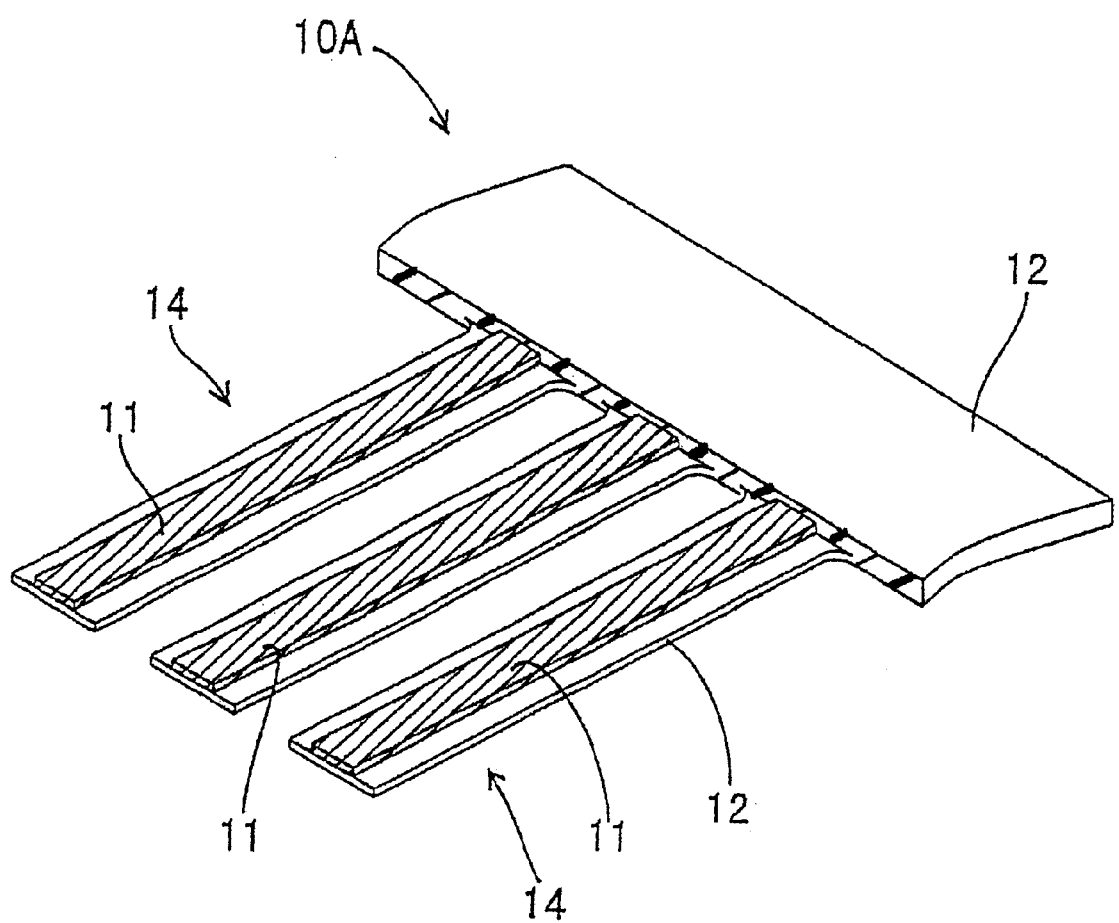
FIG. 15 is a perspective view illustrating a structure of terminals of an FFC, according to a fourth embodiment of the present invention.
Figure 16:
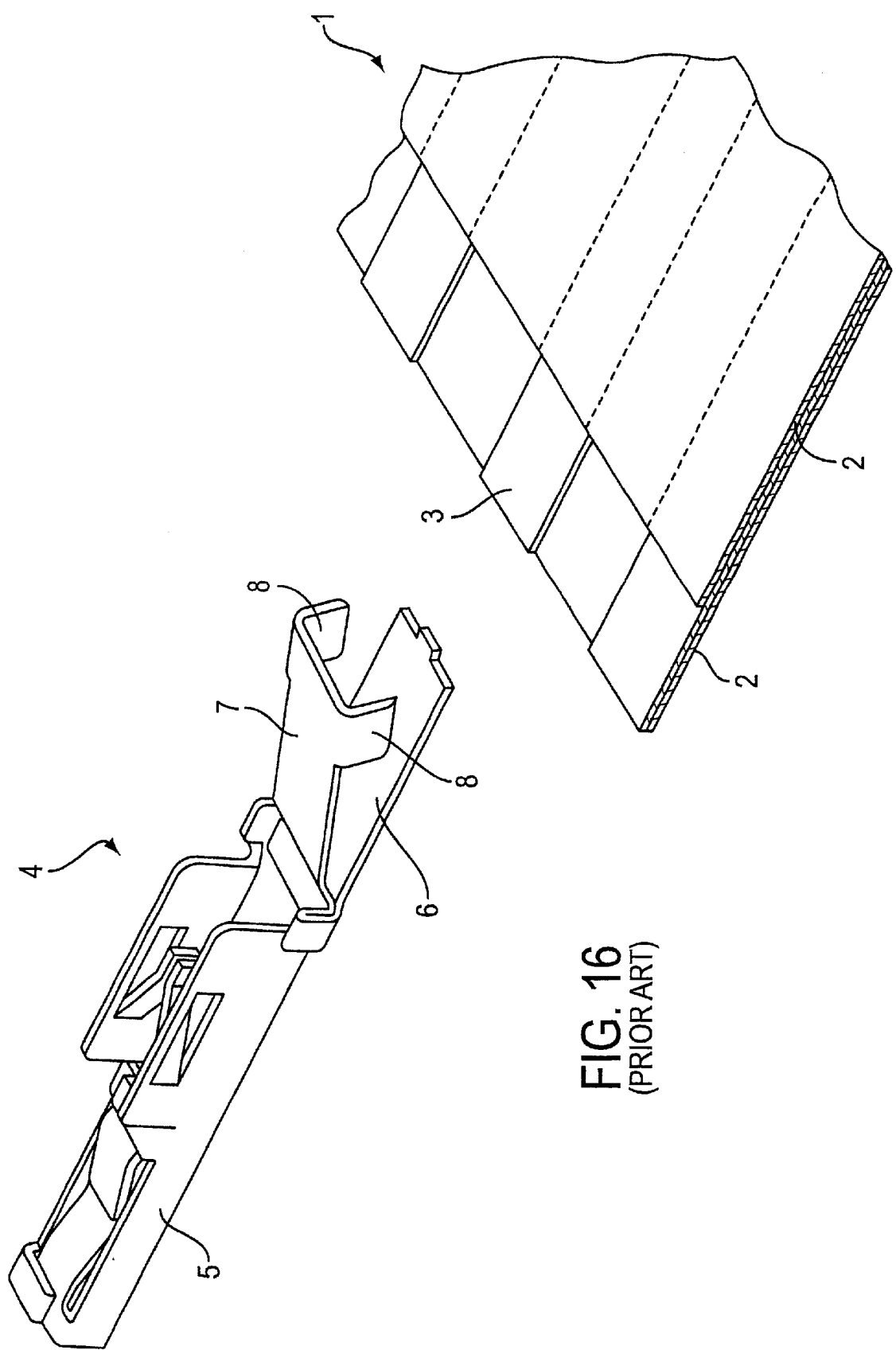
FIG. 16 is a perspective view illustrating a conventional terminal hardware and a FFC.

FIG. 15 shows a fourth embodiment of the present invention. In the fourth embodiment, the shape of the terminal end of the FFC 10A is changed. Here, the terminal end of the FFC 10A is formed in a comb-shape by leaving only portions of insulation where the conductors 11 are provided.

When the terminal hardware 20 of the first embodiment is connected to the FFC 10A, the crimping portions 26 provided on the base plate 22 hold the comb-tooth portion 14 and are crimped to the opposite side edges of the top plate 23 to be fixed with each other. In this case, since the crimping portion 26 is not required to pierce the insulating sheet 12, the connecting operation of the terminal hardware becomes easier. Further, a possibility to damage the FFC 10A can be reduced.

Since the comb-tooth portion 14 is bent in an undulating-shape, and the undulating-shaped portion engages with the base plate 22 and the top plate 23, the holding power against the tension tending to separate the terminal hardware from the terminal can be increased.

The terminal hardware 20B of the third embodiment can also be connected to the FFC 10A. Since the two pairs of crimping portions 26 simply hold the comb-tooth portion 14, the crimping portions 26 cannot provide a holding power against the tensile direction. However, in addition to the comb-tooth portion 14 being bent in an undulating-shape to be engaged with the top plate 23B and the base plate 22B, the cut-in projections 44 forcefully press against and bite into the conductor 11. Accordingly, the holding power against a tension tending to separate the terminal hardware from the terminal can be achieved sufficiently.

It is noted that the present invention is not limited by the embodiments explained above using the description and drawings, but the following embodiments, for example, can also be included in the scope of the present invention. Further, in addition to the following, the present invention can be embodied with a variety of changes in so far as it does not depart from the subject of the present invention.

(1) The embodiments described above have a top plate unitarily provided with the base plate, and have an advantage that the handling of the terminal hardware is convenient and easier. However, it is possible to provide the top plate separately from the base plate.

(2) The terminal hardware can be connected with the terminal so that the top plate and the base plate are reversed. In this case, the base plate contacts the conductor.

(3) The crimping portions can be provided on the top plate instead of the base plate. Further, the crimping portion can be provided only at one side edge of the top or bottom plate, instead of a pair of them provided on opposite side edges.

(4) In the embodiments described above, the widths of the base plate and the top plate are wider than the width of the conductor. However, the widths of the base plate and the top plate can be narrower than the conductor so that the crimping portions pierce the conductor.

(5) In the embodiments described above, the tips of the crimping portions have sharp points to pierce the FFC easily. However, when the crimping portion holds the comb-tooth portion as shown in the fourth embodiment, the sharp points are not required.

(6) a female-type terminal hardware can be provided according to the present invention as well as the male-type terminal hardware.

(7) The terminal hardware of the present invention can be used with flat-type conductor, such as an FPC (flexible printed circuit), which has a conductor covered by insulating layers, formed in a flat-shape and exposed at a terminal end, as well as the FFC explained in the embodiment described above, as an example.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

The present disclosure relates to subject matter contained in priority Japanese Application No. HEI 11-301326, filed on Oct. 22, 1999, which is herein expressly incorporated by reference in its entirety.

What is claimed is:

1. A terminal hardware connectable to a terminal end of a flat-type conductor having a conductor exposed on one surface, the terminal hardware comprising:

a pair of plates that face each other to receive the conductor therebetween; and a crimping portion that projects from a side edge of one of said pair of plates and that is bendable and crimpable to a side edge of the other one of said pair of plates;

wherein said pair of plates respectively has first and second undulating portions, said first and second undulating portions including a ridge and two wide areas provided at opposite sides of said ridge so that when the flat-type conductor is inserted between said plates the amount of compression on the conductor is greater at said wide areas than at said ridge, said first and second undulating portions undulating in a longitudinal direction of said pair of plates and being configured to contact each other.

2. The terminal hardware according to claim 1, wherein said first and second undulating portions are configured to fit against each other without a gap when the flat-type conductor is not inserted therebetween.

3. The terminal hardware according to claim 1, wherein said pair of plates is formed unitarily and in one piece so as to be able to be opened and closed.

4. The terminal hardware according to claim 1, wherein said first and second undulating portions include a ridge and two troughs provided at opposite sides of said ridge in said longitudinal direction of said pair of plates.

5. The terminal hardware according to claim 1, wherein said crimping portion comprises a pair of crimping portions that project from opposite side edges of one of said pair of plates and that are bendable and crimpable to opposite side edges of the other one of said pair of plates.

6. The terminal hardware according to claim 1, further comprising a cut-in projection provided on one of said pair of plates that faces the exposed surface of the conductor, and said cut-in projection is configured to forcefully press against and bite into the conductor.

7. The terminal hardware according to claim 6, wherein said cut-in projection is formed by cutting an edge of a triangle in one of said pair of plates and by embossing said triangle to have a wedge shape; and
    wherein said pair of plates has in said longitudinal direction a rearward end at which said terminal hardware can be separated from the terminal end of the flat-type conductor and a forward end opposite said rearward end, and said cut edge is perpendicular to said longitudinal direction of said pair of plates and is located forwardly of said rearward end.

8. The terminal hardware according to claim 6, wherein said cut-in projection is located at substantially the same position in said longitudinal direction of said pair of plates as a position of said crimping portion.

9. The terminal hardware according to claim 6, wherein said first and second undulating portions include two troughs spaced in said longitudinal direction of said pair of plates.

10. The terminal hardware according to claim 9, wherein said pair of plates has in said longitudinal direction a rearward end at which said terminal hardware can be separated from the terminal end of the flat-type conductor and a forward end opposite said rearward end, and said cut-in projection comprises first and second cut-in projections, said first cut-in projection is provided between said two troughs, and said second cut-in section is provided at said rearward end.

11. The terminal hardware according to claim 7, wherein said pair of plates has in said longitudinal direction a rearward end at which said terminal hardware can be separated from the terminal end of the flat-type conductor and a forward end opposite said rearward end, and said crimping portion comprises a first pair of crimping portions and a second pair of crimping portions, said first pair of crimping portions is provided on opposite side edges between said two troughs, and said second pair of crimping portions is provided on opposite side edges at said rearward end.

12. A terminal hardware connectable to a terminal end of a flat-type conductor having a conductor exposed on one surface, the terminal hardware comprising:
    a pair of plates that face each other to receive the conductor therebetween;
    a crimping portion that projects from a side edge of one of said pair of plates and that is bendable and crimpable to a side edge of the other one of said pair of plates; and
    a cut-in projection provided on one of said pair of plates that faces the exposed surface of the conductor, and said cut-in projection is configured to forcefully press against and bite into the conductor;
        wherein said pair of plates respectively has first and second undulating portions, said first and second undulating portions undulating in a longitudinal direction of said pair of plates and being configured to contact each other;
        wherein said cut-in projection is formed by cutting an edge of a triangle in one of said pair of plates and by embossing said triangle to have a wedge shape; and
        wherein said pair of plates has in said longitudinal direction a rearward end at which said terminal hardware can be separated from the terminal end of the flat-type conductor and a forward end opposite said rearward end, and said cut edge is perpendicular to said longitudinal direction of said pair of plates and is located forwardly of said rearward end.

13. A terminal hardware connectable to a terminal end of a flat-type conductor having a conductor exposed on one surface, the terminal hardware comprising:
    a pair of plates that face each other to receive the conductor therebetween; and
    a crimping portion that projects from a side edge of one of said pair of plates and that is bendable and crimpable to a side edge of the other one of said pair of plates;
        wherein said pair of plates respectively has first and second undulating portions, said first and second undulating portions undulating in a longitudinal direction of said pair of plates and being configured to contact each other; and
        wherein said pair of plates is formed unitarily and in one piece so as to be able to be opened and closed.

14. A terminal hardware connectable to a terminal end of a flat-type conductor having a conductor exposed on one surface, the terminal hardware comprising:
    a pair of plates that face each other to receive the conductor therebetween; and
    a crimping portion that projects from a side edge of one of said pair of plates and that is bendable and crimpable to a side edge of the other one of said pair of plates;
        wherein said pair of plates respectively has first and second undulating portions, said first and second undulating portions undulating in a longitudinal direction of said pair of plates and being configured to contact each other; and
        wherein said first and second undulating portions include a ridge and two troughs provided at opposite sides of said ridge in said longitudinal direction of said pair of plates.

15. A terminal hardware connectable to a terminal end of a flat-type conductor having a conductor exposed on one surface, the terminal hardware comprising:
    a pair of plates that face each other to receive the conductor therebetween; and
    a crimping portion that projects from a side edge of one of said pair of plates and that is bendable and crimpable to a side edge of the other one of said pair of plates;
        wherein said pair of plates respectively has first and second undulating portions, said first and second undulating portions undulating in a longitudinal direction of said pair of plates and being configured to contact each other; and
        wherein said first and second undulating portions include two troughs spaced in said longitudinal direction of said pair of plates.

16. A terminal hardware connectable to a terminal end of a flat-type conductor having a conductor exposed on one surface, the terminal hardware comprising:
    a pair of plates that face each other to receive the conductor therebetween;

a crimping portion that projects from a side edge of one of said pair of plates and that is bendable and crimpable to a side edge of the other one of said pair of plates; and a cut-in projection provided on one of said pair of plates that faces the exposed surface of the conductor, and said cut-in projection is configured to forcefully press against and bite into the conductor;

wherein said pair of plates respectively has first and second undulating portions, said first and second undulating portions undulating in a longitudinal direction of said pair of plates and being configured to contact each other; and wherein said cut-in projection is located at substantially the same position in said longitudinal direction of said pair of plates as a position of said crimping portion.

* * * * *